United States Patent [19]

Miller et al.

[11] Patent Number: 4,640,886

[45] Date of Patent: Feb. 3, 1987

[54] SUBBED LITHOGRAPHIC PRINTING PLATE

[75] Inventors: Gary R. Miller, Fort Collins, Colo.; Richard E. Gilson, Rochester, N.Y.

[73] Assignee: Eastman Kodak Company, Rochester, N.Y.

[21] Appl. No.: 786,013

[22] Filed: Oct. 10, 1985

[51] Int. Cl.$^4$ .......................... G03C 1/495; C23C 1/08
[52] U.S. Cl. ................................... 430/271; 430/272; 430/278; 430/525; 430/531
[58] Field of Search ............... 430/271, 272, 275, 276, 430/278, 525, 529, 531, 533, 536

[56] References Cited

U.S. PATENT DOCUMENTS

| | | | |
|---|---|---|---|
| 2,186,946 | 1/1940 | Wood | 41/41.5 |
| 3,275,441 | 9/1966 | Cohn | 96/75 |
| 3,342,601 | 9/1967 | Houle et al. | 96/86 |
| 3,634,078 | 1/1972 | Uhlig | 96/1.5 |
| 3,843,368 | 10/1974 | Yamamoto et al. | 96/67 |
| 3,860,426 | 1/1975 | Cunningham et al. | 96/86 P |
| 3,881,998 | 5/1975 | Miyosawa | 204/17 |
| 3,884,698 | 5/1975 | Kokihama et al. | 117/217 |
| 4,086,092 | 4/1978 | Golda et al. | 96/86 |
| 4,152,160 | 5/1979 | Ikienove et al. | 96/89 |
| 4,401,739 | 8/1983 | Senga et al. | 430/16 |
| 4,427,765 | 1/1984 | Mohr et al. | 430/525 |
| 4,427,766 | 1/1984 | Mohr | 430/525 |
| 4,467,028 | 7/1984 | Huang et al. | 430/302 |

FOREIGN PATENT DOCUMENTS

| | | |
|---|---|---|
| 0101210 | 2/1984 | European Pat. Off. |
| 0126535 | 7/1983 | Japan . |
| 0137948 | 8/1984 | Japan . |
| 856993 | 12/1960 | United Kingdom . |
| 895276 | of 1962 | United Kingdom . |
| 1443369 | 7/1976 | United Kingdom . |

Primary Examiner—John E. Kittle
Assistant Examiner—Patrick J. Ryan
Attorney, Agent, or Firm—Alfred P. Lorenzo

[57] ABSTRACT

A lithographic printing plate comprises an anodized aluminum support material, a radiation-sensitive layer and a hydrophilic subbing layer containing benzoic acid in an amount sufficient to improve the incubation stability of the plate.

9 Claims, No Drawings

SUBBED LITHOGRAPHIC PRINTING PLATE

CROSS REFERENCE TO RELATED APPLICATIONS

Reference is hereby made to commonly-assigned copending U.S. patent applications Ser. No. 786,012 entitled Anodized Aluminum Support, Method for the Preparation thereof and Lithographic Printing Plate Containing Same filed in the names of G. R. Miller and R. E. Gilson concurrently herewith and Ser. No. 786,403 entitled Treated Anodized Aluminum Support, Method for the Preparation thereof and Lithographic Printing Plate Containing Same filed in the names of R. E. Gilson and G. R. Miller concurrently herewith.

BACKGROUND OF THE INVENTION

1. Field of the Invention

This invention relates to a subbing layer for a lithographic printing plate and to a lithographic printing plate comprising such subbing layer exhibiting improved incubation stability and extended shelf-life.

2. Description of the Prior Art

One important characteristic of any presensitized lithographic printing plate is the ability to remain stable and yield reproducible speed performance between the time the plate is manufactured and subsequently used.

U.S. Pat. No. 4,086,092 describes a method of manufacturing presensitized lithographic printing plates demonstrating an extended shelf-life wherein a potassium zirconium fluoride solution is coated on the surface of an aluminum sheet. Thereafter, the aluminum sheet is treated with a sodium silicate solution.

U.S. Pat. No. 4,427,765 notes under column 4 that lithographic printing support materials prepared in accordance with known methods in many cases do not satisfy current printing requirements because after treatment with alkali metal silicates (which leads to good developability and hydrophilic character) a certain deterioration of the shelf-life of light-sensitive layers must be accepted.

U.S. Pat. No. 4,467,028 discloses a planograpic printing plate having an anodized metal substrate, a photosensitive layer and an interlayer comprising a hydroxy-substituted organic acid which minimizes background dye staining.

Thus, there is a need for lithographic printing plates exhibiting improved incubation stability and extended shelf-life.

SUMMARY OF THE INVENTION

In accordance with the present invention, there is provided a lithographic printing plate having improved incubation stability and an extended shelf-life.

The present invention provides a lithographic printing plate comprising an anodized aluminum support material, a radiation-sensitive layer and a hydrophilic subbing layer containing benzoic acid in an amount sufficient to improve the incubation stability of the plate.

DETAILED DESCRIPTION OF PREFERRED EMBODIMENTS

The support material comprises an aluminum or aluminum alloy plate. Suitable aluminum alloys are alloys with zinc, silicon, chromium, copper, manganese, magnesium, chromium, zinc, lead, bismuth, nickel, iron or titanium which may contain negligible amounts of impurities.

The surface of the aluminum plate is preferably subjected to chemical cleaning such as degreasing with solvents or alkaline agents for the purpose of exposing a clean surface free of grease, rust or dust which is usually present on the aluminum surface. Preferably, the surface is grained. Suitable graining methods include glass bead graining, ball graining, sand blasting, brush graining and electrolytic graining. Following the graining operation, the support can be treated with an aluminum etching agent and a desmutting acid bath.

An anodized stratum is then formed on the aluminum plate. An electric current is passed through the support plate immersed as a cathode in a solution containing one or more acids selected from phosphoric acid, sulfuric acid, oxalic acid, boric acid, chromic acid, sulfamic acid, and benzene-sulfonic acid. An anodized stratum is thus formed on the surface of the support. In a preferred embodiment of this invention, the support comprises an anodized aluminum stratum consisting essentially of oxides and phosphates of aluminum as described in our copending U.S. application Ser. No. 786,012 entitled Anodized Aluminum Support, Method for the Preparation thereof and Lithographic Printing Plate Containing Same, hereby incorporated by reference in its entirety.

After anodizing, the surface of the anodized aluminum plate preferably is contacted with a silicating agent such as an alkali metal silicate, calcium silicate, silicic acid, colloidal silica or polymerized silicic acid to silicate the support. The silicate treatment renders the anodized surface hydrophilic. Preferably, the support is treated with an aqueous solution of the silicating agent. The silicating agent preferably is present at a concentration of 0.5 to 10% and the temperature of the solution preferably is 60° to 100° C. The dwell time of the support in the silicate bath depends on the solution temperature, silicating agent concentration and the ultimate intended use of the lithographic plate. A dwell time of 15 to 80 seconds has been found to be particularly advantageous.

In a preferred embodiment of this invention, the anodized aluminum plate is treated in accordance with the teaching of our copending U.S. application Ser. No. 786,403, entitled Treated Anodized Aluminum Support, Method for the Preparation thereof and Lithographic Printing Plate Containing Same, hereby incorporated by reference in its entirety. Thus, the anodized aluminum plate can be contacted with a silicating agent as described above and subsequently can be contacted with a metal salt having the formula MX wherein M is a metal selected from the group consisting of Zn, Mg, Ni and Cr and X is an anion selected from the group consisting of acetate, borate, and chloride.

In accordance with this invention, there is provided a hydrophilic subbing layer for the abovedescribed lithographic printing support. Hydrophilic polymers useful in preparing the subbing layer of this invention include polyacrylic acid, a copolymer based on polyacrylic acid, polyacrylamide, a copolymer based on polyacrylamide, a carboxyalkylcellulose having alkyl groups from $C_1$ to $C_3$, or the mixed ethers thereof, a copolymer based on ethylene, vinyl acetate, styrene or vinylmethylether and maleic anhydride which optionally has been hydrolyzed and/or partly or completely subjected to ammonolysis with $NH_3$, polyvinyl alcohol, polyvinylphosphonic acid and polyvinyl pyrrolidone.

The hydrophilic polymer which is particularly useful in carrying out the invention preferably is a water soluble cellulosic compound, for example, a carboxyalkylcellulose salt such as a salt of carboxymethylcellulose, carboxyethylcellulose or carboxypropylcellulose. Preferably, the sodium salt is used. It can be applied in an amount of about 5 mg/m² to 225 mg/m², preferably 15 mg/m² to 55 mg/m² on the anodized surface. Methylcellulose and hydroxypropyl methylcellulose derivatives may also be used. Hydroxyalkylcellulose can also be used including hydroxymethylcellulose, hydroxyethylcellulose or hydroxypropylcellulose. The molecular weight of the cellulose compound varies widely from about 80,000 to about 700,000.

The hydrophilic subbing layer of this invention comprises benzoic acid in an amount sufficient to improve the incubation stability and shelf-life of the lithographic printing plate. The benzoic acid preferably is present in a dry coverage between about 1 mg/m² and 50 mg/m², preferably between about 5 mg/m² and 20 mg/m² of the support surface.

In a preferred embodiment of this invention the hydrophilic subbing layer comprises a compound selected from the group consisting of alkali metal molybdates. Such compounds include sodium molybdate and potassium molybdate. The alkali metal molybdate is present in a dry coverage between about 1 mg/m² and 50 mg/m², preferably between about 5 mg/m² and 20 mg/m² of the support surface. The alkali metal molybdate improves the coatability of the hydrophilic coating composition and reduces mottle.

In another embodiment of this invention, the hydrophilic subbing layer contains a metal salt incorporated therein to improve the resistance to scumming when the lithographic plate is used on a lithographic printing press. The metal salts which are particularly useful include water-soluble salts of zinc, calcium, magnesium, barium, strontium, cobalt, or manganese, which are formed with mineral acids or organic acids. Particularly preferred are the water-soluble salts of zinc, calcium, magnesium, barium, strontium, cobalt or manganese and carboxylic acids such as acetic acid, salicylic acid, etc. The salts are formed by methods known in the art. Typical inorganic acid salts include, for example, bromates, bromides, chlorates, chlorides, dithionates, iodides, nitrates, salicylates, acetates, sulfates, etc. of the above listed metals.

The hydrophilic subbing layer of this invention preferably comprises a surfactant. The surfactant is added to the coating composition in an amount sufficient to improve the coatability and flow characteristics. Surfactants useful herein include anionic, cationic and non-ionic surfactants. Examples of suitable surfactants are as follows:
sodium dodecyl benzene sulfonate,
ammonium lauryl ether sulfonate,
dioctyl sodium sulfosuccinate,
tetrasodium N-Cl,
2-dicarboxyethyl-1-N-octadecyl sulfosuccinate,
sodium Xylene sulfonate,
sodium toluene sulfonate,
Sodium cumene sulfonate,
sodium dihexyl sulfosuccinate,
sodium diamyl sulfosuccinate,
anionic phosphate surfactant,
sodium alkylaryl polyether sulfate,
phosphate surfactant, potassium salt,
sodium alkylaryl polyether sulfonate and a non-ionic perfluoroalkyl sulfonamido polyalkyleneoxide ester.

Suitable subbing compositions are prepared in an aqueous solution although it will be realized that additional solvents may also be employed. The subbing composition is coated onto the support by methods well known in the art.

Radiation sensitive materials useful in this invention are well known in the art, and include silver halide emulsions, as described in Research Disclosure, publication 17643, paragraph XXV, December, 1978 and references noted therein; quinone diazides (polymeric and non-polymeric), as described in U.S. Pat. No. 4,141,733 (issued Feb. 27, 1979 to Guild) and references noted therein; light sensitive polycarbonates, as described in U.S. Pat. No. 3,511,611 (issued May 12, 1970 to Rauner et al) and references noted therein; diazonium salts, diazo resins, cinnamal-malonic acids and functional equivalents thereof and others described in U.S. Pat. No. 3,342,601 (issued Sept. 19, 1967 to Houle et al) and references noted therein; and light sensitive polyesters, polycarbonates and polysulfonates, as described in U.S. Pat. No. 4,139,390 (issued Feb. 13, 1979 to Rauner et al) and references noted therein.

Particularly useful radiation sensitive materials are photocrosslinkable polymers, such as polyesters, containing the photosensitive group

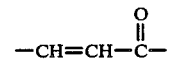

as an integral part of the polymer backbone. For example, preferred photocrosslinkable polymers are polyesters prepared from one or more compounds represented by the following formulae:

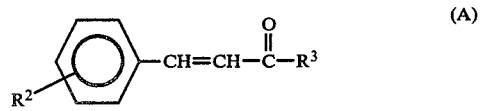

(A)

wherein $R^2$ is one or more alkyl of 1 to 6 carbon atoms, aryl of 6 to 12 carbon atoms, aralkyl of 7 to 20 carbon atoms, alkoxy of 1 to 6 carbon atoms, nitro, amino, acrylic, carboxyl, hydrogen or halo and is chosen to provide at least one condensation site; and $R^3$ is hydroxy, alkoxy of 1 to 6 carbon atoms, halo or oxy if the compound is an acid anhydride. A preferred compound is p-phenylene diacrylic acid or a functional equivalent thereof. These and other useful compounds are described in U.S. Pat. No. 3,030,208 (issued Apr. 17, 1962 to Schellenberg et al); U.S. Pat. No. 3,702,765 (issued Nov. 14, 1972 to Laakso); and U.S. Pat. No. 3,622,320 (issued Nov. 23, 1971 to Allen), the disclosures of which are incorporated herein by reference.

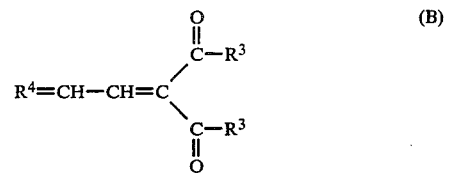

(B)

$R^3$ is as defined above, and $R^4$ is alkylidene of 1 to 4 carbon atoms, aralkylidene of 7 to 16 carbon atoms, or a 5- to 6-membered heterocyclic ring. Particularly useful compounds of formula (B) are cinnamylidenemalonic acid, 2-butenylidenemalonic acid, 3-pentenylidenemalonic acid, o-nitrocinnamylidenemalonic acid, naphthylallylidenemalonic acid, 2-furfurylideneethylidenemalonic acid and functional equivalents thereof. These and other useful compounds are described in U.S. Pat. No. 3,674,745 (issued July 4, 1972 to Philipot et al), the disclosure of which is incorporated herein by reference.

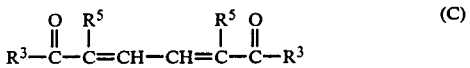
(C)

$R^3$ is as defined above; and $R^5$ is hydrogen or methyl. Particularly useful compounds of formula (C) are trans, trans-muconic acid, cis, transmuconic acid, cis, cis-muconic acid, $\alpha,\alpha'$-cis, trans-dimethylmuconic acid, $\alpha,\alpha'$-cis, cis-dimethylmuconic acid and functional equivalents thereof. These and other useful compounds are described in U.S. Pat. No. 3,615,434 (issued Oct. 26, 1971 to McConkey), the disclosure of which is incorporated herein by reference.

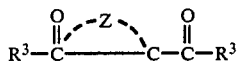
(D)

$R^3$ is as defined above; and Z represents the atoms necessary to form an unsaturated, bridged or unbridged carbocyclic nucleus of 6 or 7 carbon atoms. Such nucleus can be substituted or unsubstituted. Particularly useful compounds of formula (D) are 4-cyclohexene-1,2-dicarboxylic acid, 5-norbornene-2,3-dicarboxylic acid, hexachloro-5[2:2:1]-bicycloheptene-2,3-dicarboxylic acid and functional equivalents thereof. These and other useful compounds are described in Canadian Pat. No. 824,096 (issued Sept. 30, 1969 to Mench et al), the disclosure of which is incorporated herein by reference.

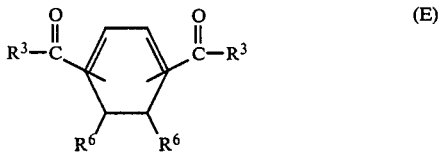
(E)

$R^3$ is as defined above; and $R^6$ is hydrogen, alkyl of 1 to 12 carbon atoms, cycloalkyl of 5 to 12 carbon atoms or aryl of 6 to 12 carbon atoms. $R^6$ can be substituted, where possible, with such substituents as do not interfere with the condensation reaction, such as halo, nitro, aryl, alkoxy, aryloxy, etc. The carbonyl groups are attached to the cyclohexadiene nucleus meta or para to each other, and preferably para. Particularly useful compounds of formula (E) are 1,3-cyclohexadiene-1,4-dicarboxylic acid, 1,3-cyclohexadiene-1,3-dicarboxylic acid. 1,5-cyclohexadiene-1,4-dicarboxylic acid and functional equivalents thereof. These and other useful compounds are described in Belgian Pat. No. 754,892 (issued Oct. 15, 1970), the disclosure of which is incorporated herein by reference.

The radiation-sensitive coating can be prepared by dispersing the radiation sensitive composition or polymer in any suitable solvent or combination of solvents used in the art.

Radiation-sensitivity can be stimulated in the coating composition by incorporating therein a sensitizer. Suitable sensitizers include anthrones, such as 1-carbethoxy-2-keto-3-methyl-2-azabenzanthrone, benzanthrone; nitro sensitizers; triphenylmethanes; quinones; cyanine dye sensitizers; naphthone sensitizers such as 6-methoxybeta-2-furyl-2-acrylonaphthone; pyrylium or thiapyrylium salts, such as 2,6-bis(p-ethoxyphenyl)-4-(p-n-amyloxyphenyl)-thiapyrylium perchlorate and 1,3,5-triphenyl-pyrylium fluoroborate; furanone; 4-picoline-N-oxide; anthraquinones such as 2-chloroanthraquinone; thiazoles such as 2-benzoylcarbethoxymethylene-1-methyl-betanaphthothiazole and methyl 2-(n-methylbenzothiazolylidene)dithioacetate; methyl 3-methyl-2-benzothiazolidene dithioacetate; thiazolines such as 3-ethyl-2-benzoylmethylenenaphtho[1,2-d]-thiazoline, benzothiazoline, (2-benzoylmethylene)-1-methyl-beta-naphthothiazoline; 1,2-dihydro-1-ethyl-2-phenacylidenenaphtho[1,2-d]-thiazole; and naphthothiazoline; quinolizones, Michler's ketone; and Michler's thioketone.

In addition to the sensitizers, a number of other addenda can be present in the coating composition and ultimately form a part of the lithographic plate. For example, dyes or pigments may be included to obtain colored images to aid in recognition. Other components which can be advantageously included in the coating composition are materials which serve to improve film formation, coating properties, adhesion of the coatings to the support, mechanical strength and stability.

The lithographic printing plate of the present invention can be exposed by conventional methods, for example through a transparency or a stencil, to an imagewise pattern of actinic radiation. Suitable radiation sources include carbon arc lamps, mercury vapor lamps, fluorescent lamps tungsten filament lamps, photoflood lamps, lasers and the like.

The exposed lithographic printing plate can be developed using conventional developer and developing techniques. For example, in developing the lithographic printing plates incorporating radiation-sensitive polyesters noted above, the developer composition is applied to the surface of the plate for a period of time sufficient to remove the polymer from non-image areas of the plate. Gentle mechanical action aids in removing the polymer composition from these areas. Thus, swabbing is a useful method of applying the developer composition to the plate. The developer composition is typically used at room temperature but it can be employed at elevated temperatures up to about 32° C. After the initial application of the developer composition, a second application can be applied, followed by either a single or double application of a desensitizing composition. The plate is then dried.

The following examples further illustrate the invention:

EXAMPLE 1

An aluminum plate was prepared and anodized in a phosphoric acid electrolyte as described in our co-pending application Ser. No. 786,012 entitled Anodized Aluminum Support, Method for the Preparation thereof and Lithographic Printing Plate Containing Same.

The anodized aluminum plate was silicated by contacting it with a silicating agent.

The anodized and silicated aluminum support material was coated with a hydrophilic subbing layer containing benzoic acid at a dry coverage of 8.6 mg/m² and carboxymethylcellulose at a dry coverage of 34.4 mg/m².

The plate was then coated with a radiation-sensitive coating as described in U.S. Pat. No. 3,030,208, a condensation product of hydroxyethoxycyclohexane and p-phenylenediethoxy acrylate.

The plate was suitably exposed and developed using the developer described in Examples 1-8 of U.S. Pat. No. 4,419,437. The development was complete.

A plate prepared as described above was stored for two weeks at 49° C. The plate was suitably exposed and developed as above. The development was complete.

Plates were prepared and tested as described above, except that the subbing layer contained only carboxymethylcellulose at a coverage of 34.4 mg/m². The plate processed shortly after manufacture developed completely. The plate stored for two weeks at 49° C. developed incompletely.

Plates were prepared and tested as described above, except that the subbing layer contained carboxymethylcellulose at a coverage of 34.4 mg/m² and p-hydroxybenzoic acid at a coverage of 8.6 mg/m². The plate processed shortly after manufacture developed completely. The plate stored for two weeks at 40° C. developed incompletely.

Plates were prepared and tested as described above, except that the subbing layer contained carboxymethylcellulose at a coverage of 34.4 mg/m² and boric acid at a coverage of 8.6 mg/m². The plate processed shortly after manufacture developed completely. The plate stored for two weeks at 49° C. developed incompletely. When boric acid was replaced with the same amount of citric acid, the results were the same.

EXAMPLE 2

An aluminum plate was prepared and anodized as described in Example 1. The anodized aluminum plate was silicated and contacted with zinc acetate, as described in our co-pending application Ser. No. 786,403 entitled Treated Anodized Aluminum Support, Method for the Preparation thereof and Lithographic Printing Plate Containing Same.

The anodized and treated aluminum support material was coated with a hydrophilic subbing layer containing carboxymethylcellulose at a dry coverage of 34.4 mg/m². The plate was coated with a radiation-sensitive coating as described in Example 1. The plate was stored for two weeks at 49° C. and then suitably exposed and developed as in Example 1. The plate exhibited a Log E speed gain of 0.44.

Plates were prepared and tested as described above, except that the hydrophilic subbing layer contained 5.1 mg/m² of benzoic acid and 5.1 mg/m² of sodium molybdate. The plate exhibited a Log E speed gain of 0.36.

Plates were prepared and tested as described above, except that the hydrophilic subbing layer contained 10.2 mg/m² of benzoic acid and 10.2 mg/m² of sodium molybdate. The plate exhibited a Log E speed gain of 0.15.

Although the invention has been described in considerable detail with particular reference to certain preferred embodiments thereof, variations and modifications can be effected within the spirit and scope of the invention.

What is claimed is:

1. In a lithographic printing plate comprising an anodized aluminum support material, a hydrophilic subbing layer and a radiation-sensitive layer, the improvement wherein said hydrophilic subbing layer comprises benzoic acid in an amount sufficient to improve the incubation stability of said plate.

2. The plate of claim 1 wherein said subbing layer comprises a carboxyalkyl cellulose.

3. The plate of claim 2 wherein said subbing layer comprises carboxymethyl cellulose.

4. The plate of claim 1 wherein said subbing layer comprises a compound selected from the group consisting of alkali metal molybdates.

5. The plate of claim 4 wherein said subbing layer comprises sodium molybdate.

6. The plate of claim 1 wherein said subbing layer further comprises a surfactant.

7. The plate of claim 1 wherein said radiation sensitive layer comprises a radiation sensitive polymer containing the grouping

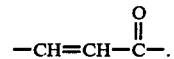

8. The plate of claim 2 wherein said subbing layer further comprises a water soluble salt of a metal selected from the group consisting of zinc, calcium, magnesium, barium, strontium, cobalt and manganese.

9. The plate of claim 1 wherein said subbing layer comprises polyacrylamide.

* * * * *